(12) United States Patent
Dakshina-Murthy et al.

(10) Patent No.: US 6,884,733 B1
(45) Date of Patent: Apr. 26, 2005

(54) USE OF AMORPHOUS CARBON HARD MASK FOR GATE PATTERNING TO ELIMINATE REQUIREMENT OF POLY RE-OXIDATION

(75) Inventors: Srikanteswara Dakshina-Murthy, Austin, TX (US); Scott A. Bell, San Jose, CA (US); David E. Brown, Austin, TX (US); Philip A. Fisher, Foster City, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/215,173

(22) Filed: Aug. 8, 2002

(51) Int. Cl.$^7$ .............................................. H01L 21/302
(52) U.S. Cl. ........................................................ 438/717
(58) Field of Search ................................ 438/717, 585, 438/587, 590, 669, 671, 942, 950, 952, 233, 299

(56) References Cited

U.S. PATENT DOCUMENTS

| | | | |
|---|---|---|---|
| 4,382,100 A | | 5/1983 | Holland |
| 5,185,293 A | * | 2/1993 | Franke et al. ................ 437/944 |
| 5,385,762 A | | 1/1995 | Prins |
| 5,656,128 A | * | 8/1997 | Hashimoto et al. ........... 216/47 |
| 5,721,090 A | | 2/1998 | Okamoto et al. |
| 5,759,746 A | * | 6/1998 | Azuma et al. ............... 430/313 |
| 5,776,602 A | | 7/1998 | Ueda et al. |
| 5,837,357 A | | 11/1998 | Matsuo et al. |
| 5,891,575 A | | 4/1999 | Marchywka et al. |
| 5,981,398 A | | 11/1999 | Tsai et al. |
| 6,030,541 A | | 2/2000 | Adkisson et al. |
| 6,121,158 A | | 9/2000 | Benchikha et al. |
| 6,171,343 B1 | | 1/2001 | Dearnaley et al. |
| 6,350,390 B1 | | 2/2002 | Liu et al. |
| 6,365,320 B1 | | 4/2002 | Foote et al. |
| 6,368,924 B1 | | 4/2002 | Mancini et al. ............. 438/286 |
| 6,388,924 B1 | | 5/2002 | Nasu ..................... 365/189.09 |
| 6,428,894 B1 | | 8/2002 | Babich et al. |
| 6,573,030 B1 | | 6/2003 | Fairbairn et al. |
| 6,596,553 B1 | | 7/2003 | Lin et al. |
| 6,673,684 B1 | * | 1/2004 | Huang et al. ............... 438/299 |
| 6,750,127 B1 | | 6/2004 | Chang et al. |

OTHER PUBLICATIONS

Wolf, S., Tauber, R. N.; Silicon Processing for the VLSI Era; Lattice Press, Sunset Beach, Ca.; 1986; pp. 322, 384–385, 556–557.*

Yamaguchi, A. et al., "Ar Ion implantation into Resist For Etching Resistance Improvement", Proceedings of SPIE vol. 4345 (2001), pp. 655–664.

Borzenko, V. et al., "The Effect of Ion Implantation On Polymer Mask Resistance To Ion Beam Etching", Vacuum, 38, 1007 (1988), pp. 1007–1009.

R. Gago, et al., "Bonding and hardness in nonhydrogenated carbon films with moderate sp$^3$ content", Journal of Applied Physics, vol. 87, No. 11, Jun. 1, 2000, 7 pgs.

* cited by examiner

*Primary Examiner*—W. David Coleman
(74) *Attorney, Agent, or Firm*—Foley & Lardner LLP

(57) ABSTRACT

A method of producing an integrated circuit eliminates the need to re-oxidize polysilicon gate conductors and lines prior to removal of a hard mask used to form the gate conductors. A layer of polysilicon is provided above a semiconductor substrate. The layer of polysilicon is then doped. A mask material comprising amorphous carbon is provided above the layer of polysilicon, and the layer of mask material is patterned to form a mask. A portion of the layer of polysilicon is removed according to the mask, and the mask is removed.

25 Claims, 4 Drawing Sheets

USE OF AMORPHOUS CARBON HARD MASK FOR GATE PATTERNING TO ELIMINATE REQUIREMENT OF POLY RE-OXIDATION

CROSS-REFERENCE TO RELATED PATENT APPLICATIONS

This application is related to U.S. patent application Ser. No. 10/230,775 entitled "Use of Buffer Dielectric Layer with Amorphous Carbon Mask to Reduce Line Warpage," U.S. patent application Ser. No. 10/277,760 entitled "Sacrificial Air Gap Layer for Insulation of Metals," U.S. patent application Ser. No. 10/244,650 entitled "Use of Multilayer Amorphous Carbon Hard Mask to Eliminate Line Warpage Phenomenon," U.S. patent application Ser. No. 10/424,420 entitled "Use of Amorphous Carbon for Gate Patterning," U.S. patent application Ser. No. 10/230,794 entitled "Formation of Amorphous Carbon ARC Stack Having Graded Transition Between Amorphous Carbon and ARC Material," U.S. patent application Ser. No. 10/335,726 entitled "Use of Diamond as a Hard Mask Material," U.S. patent application Ser. No. 10/424,675 entitled "Selective Stress-Inducing Implant and Resulting Pattern Distortion in Amorphous Carbon Patterning," U.S. patent application Ser. No. 10/445,129 entitled "Modified Film Stack and Patterning Strategy for Stress Compensation and Prevention of Pattern Distortion in Amorphous Carbon Gate Patterning," and U.S. patent application Ser. No. 10/217,730 entitled "Ion Implantation to Modulate Amorphous Carbon Stress," each of which is assigned to the assignee of the present application.

FIELD OF THE INVENTION

The present invention relates generally to the field of integrated circuits and methods of manufacturing integrated circuits. More particularly, the present invention relates to the use of masks formed of amorphous carbon to form features in integrated circuits.

BACKGROUND OF THE INVENTION

Deep-submicron complementary metal oxide semiconductor (CMOS) is conventionally the primary technology for ultra-large scale integrated (ULSI) circuits. Over the last two decades, reduction in the size of CMOS transistors has been a principal focus of the microelectronics industry.

Transistors (e.g., MOSFETs), are often built on the top surface of a bulk substrate. The substrate is doped to form source and drain regions, and a conductive layer is provided between the source and drain regions. The conductive layer operates as a gate for the transistor; the gate controls current in a channel between the source and the drain regions.

Ultra-large-scale integrated (ULSI) circuits generally include a multitude of transistors, such as, more than one million transistors and even several million transistors that cooperate to perform various functions for an electronic component. The transistors are generally complementary metal oxide semiconductor field effect transistors (CMOSFETs) which include a gate conductor disposed between a source region and a drain region. The gate conductor is provided over a thin gate oxide material. Generally, the gate conductor can be a metal, a polysilicon, or polysilicon/germanium ($Si_xGe_{(1-x)}$) material that controls charge carriers in a channel region between the drain and the source to turn the transistor on and off. Conventional processes typically utilize polysilicon based gate conductors because metal gate conductors are difficult to etch, are less compatible with front-end processing, and have relatively low melting points. The transistors can be N-channel MOSFETs or P-channel MOSFETs.

Generally, it is desirable to manufacture smaller transistors to increase the component density on an integrated circuit. It is also desirable to reduce the size of integrated circuit structures, such as vias, conductive lines, capacitors, resistors, isolation structures, contacts, interconnects, etc. For example, manufacturing a transistor having a reduced gate length (a reduced width of the gate conductor) can have significant benefits. Gate conductors with reduced widths can be formed more closely together, thereby increasing the transistor density on the IC. Further, gate conductors with reduced widths allow smaller transistors to be designed, thereby increasing speed and reducing power requirements for the transistors.

One issue that must be considered in fabricating integrated circuits is damage to gate structures resulting from the removal of etch masks overlying the gate structure. In conventional gate fabrication, gate structures may be produced from a polysilicon-containing material that is pre-doped with n-type (e.g., phosphorous) or p-type (e.g., boron) ions to alter the electrical characteristics of the gate. Specifically, the workfunction of the gate electrode is modulated by pre-doping polysilicon to n- or p-type, which allows formation of transistors with a predetermined threshold voltage. To form the gates, an anti-reflective coating (ARC) layer (e.g., silicon nitride (SiN), silicon oxynitride (SiON), etc.) or similar nitride-based dielectric may be patterned to form a mask for the polysilicon material. When the ARC layer is removed using a phosphoric acid ($H_3PO_4$) strip, the acid can attack exposed gate structures. Damage to the gate structures is particularly pronounced for n-type doped gates. To minimize the effects on n-type gates, a polysilicon re-oxidation step is typically performed to form a thin layer of oxide on the sides of the gate structures, which resists damage to the gate structures during the phosphoric acid strip.

One difficulty with a poly-reoxidation step to form an oxide layer on the side of the gate structures is that polysilicon re-oxidation is performed at an elevated temperature that increases the thermal budget of processing. It is desirable to reduce the overall thermal budget to reduce the tendency for diffusion of materials in active regions of the integrated circuit.

Another difficulty is that the oxide formed on the sides of the gate structures during the polysilicon re-oxidation is not localized on the sides of the gate structures, but extends to a point near the thin gate oxide layer underlying the gate conductor material. The newly-formed oxide may encroach into the gate oxide layer, which may adversely increase the thickness of the gate oxide or reduce the shape definition of the corner between the gate structure and the underlying substrate. Thus, the polysilicon re-oxidation may affect the precision with which gate structures may be formed.

Thus, there is a need to form structures in an integrated circuit using an improved method that produces structures having reduced critical dimensions. Further, there is a need to form gate structures that are not damaged by the removal of mask layers used to form the gate structures. Even further, there is a need to use amorphous carbon as a mask in the formation of integrated circuit structures. Even further still, there is a need to form gate structures without the use of a polysilicon re-oxidation process that may result in damage to the gate oxide and adversely affect definition of the gate structure. Yet further still, there is a need for a method of producing integrated circuit gate structures that does not increase the thermal budget of processing and that does not damage gate structures during processing.

SUMMARY OF THE INVENTION

An exemplary embodiment relates to a method of producing an integrated circuit. The method includes providing a layer of polysilicon above a semiconductor substrate and doping the layer of polysilicon. The method also includes providing a layer of mask material above the layer of polysilicon, where the mask material comprises amorphous carbon. The method further includes patterning the layer of mask material to form a mask, removing a portion of the layer of polysilicon according to the mask to form a gate conductor, and removing the mask.

Another exemplary embodiment relates to a method of forming features in an integrated circuit. The method includes providing a layer of conductive material above a semiconductor substrate, where the layer of conductive material comprises polysilicon and a dopant element. The method also includes providing an amorphous carbon layer above the layer of conductive material, providing a cap layer over the amorphous carbon layer, and patterning the cap layer to form a cap feature. The method further includes removing a portion of the amorphous carbon layer according to the cap feature to form a hard mask, etching the layer of conductive material according to the hard mask to form a feature, and removing the hard mask. The step of removing the hard mask may be accomplished without the need to oxidize the feature formed in the layer of conductive material.

A further exemplary embodiment relates to an integrated circuit produced by a method that includes depositing a layer of gate material above a silicon wafer. The method also includes doping the layer of gate material with at least one ion species and forming a mask over the layer of gate material, where the mask comprises an amorphous carbon material. The method further includes removing a portion of the layer of gate material according to the mask and removing the mask. The mask may be removed without the use of an aqueous acid etchant.

Other principal features and advantages will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF THE PREFERRED EMBODIMENTS

Figure 1:
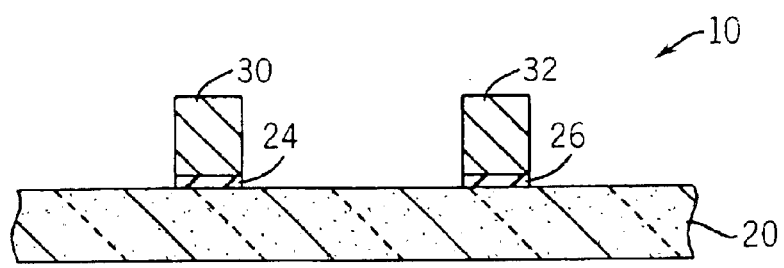
FIG. 1 is a schematic cross-sectional view of a portion of an integrated circuit including a pair of gate structures fabricated in accordance with an exemplary embodiment.

Referring to FIG. 1, a portion 10 of an integrated circuit (IC) includes a substrate 20 (e.g. a silicon wafer), line or gate conductors 30, 32, and oxide layers 24, 26. Oxide layers 24, 26 may be referred to as gate oxide layers. Portion 10 is preferably part of an ultra-large-scale integrated (ULSI) circuit having a million or more transistors, and is manufactured as part of the IC on a wafer made of a semiconducting material (e.g., silicon, gallium arsenide, etc.).

Gate conductors 30, 32 can be a polysilicon or polysilicon/germanium ($Si_xGe_{(1-x)}$) material that controls charge carriers in a channel region formed between source and drain regions in substrate 20 to turn the transistor on and off. Gate conductors 30, 32 may be doped or undoped. In an exemplary embodiment, gate conductors 30, 32 are made of a polysilicon material that is doped with n-type (e.g., phosphorous) or p-type (e.g., boron) dopants and have a thickness between approximately 1000 and 2000 angstroms and a width of between approximately 30 and 50 nanometers. Alternatively, gate conductors 30, 32 can be part of flash memory gate stacks.

A method for producing portion 10 without the need for a re-oxidation of gate conductors 30, 32 is described below with reference to FIGS. 2 to 9. FIG. 10 is a flow diagram that outlines a process 200 used in the formation of portion 10.

Figure 2:
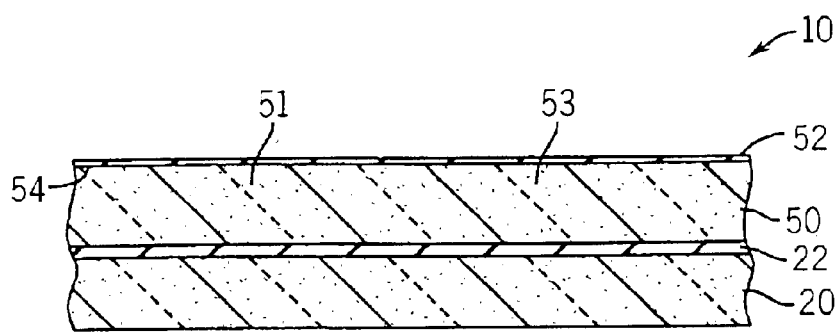
FIG. 2 is a schematic cross-sectional view of the portion shown in FIG. 1 illustrating a polysilicon and oxide layer deposition step.

In a step 210 illustrated in FIG. 2, a layer of conductive or semiconductive material 50 is provided above or over a layer 22 of dielectric material 22, which is in turn provided above substrate 20. Layer of dielectric material 22 may be any of a variety of materials suitable for use as a gate dielectric material (e.g., silicon dioxide, silicon nitride, etc.). In a preferred embodiment, layer of dielectric material 22 comprises silicon dioxide thermally grown on substrate 20.

Layer of conductive or semiconductive material 50 may be any of a variety of materials suitable for use in a conductive line or gate conductor (e.g., polysilicon, polysilicon/germanium ($SiXGe_{(1-x)}$), etc.). In a preferred embodiment, layer of conductive or semiconductive material 50 comprises polysilicon. Layer of conductive or semiconductive material 50 may be deposited by chemical vapor deposition or any other suitable method. In an alternative embodiment, layer of conductive or semiconductive material 50 may include multiple layers of material, one or more of which may include polysilicon.

In an exemplary embodiment, layer of conductive or semiconductive material 50 has a thickness of between approximately 1,500 and 2,000 angstroms and layer of dielectric material 22 has a thickness of between approximately 15 and 20 angstroms. In an alternative embodiment, layer of conductive or semiconductive material 50 has a thickness of between approximately 1,000 and 2,500 angstroms and layer of dielectric material 22 has a thickness of approximately 10 and 50 angstroms. Alternatively, layer of dielectric material 22 can be other types of materials used in the formation of narrow lines or structures.

When layer of conductive or semiconductive material 50 is formed, a thin oxide layer 52 forms on the top or upper surface 54 of layer of conductive or semiconductive material 50. Oxide layer 52 may be referred to as a "native" oxide layer. The thickness of oxide layer 52 may vary depending on various processing conditions, and may have a discontinuous or varying thickness. In an exemplary embodiment, the thickness of oxide layer 52 is between approximately 5 and 20 angstroms.

In a step 220, layer of conductive or semiconductive material 50 is doped with n-type or p-type dopants to create doped regions 51, 53. For example, layer of conductive or semiconductive material 50 may be doped with at least one of phosphorous (P), boron (B), arsenic (As), antimony (Sb), and indium (In). In an exemplary embodiment, doped region 51 is doped using an ion implantation technique in which boron ions are accelerated at an energy of between approximately 4 and 8 keV and a dose of $10 \times 10^{15}$ atoms/cm$^2$ to produce a region having a concentration of between approximately $1 \times 10^{19}$ and $1 \times 10^{20}$ atoms/cm$^3$. Also in this exemplary embodiment, doped region 53 is doped using an ion implantation technique in which phosphorous ions are accelerated at an energy of between approximately 10 and 15 keV a dose of $4 \times 10^{15}$ atoms/cm$^2$ to produce a region having a concentration of between approximately $1 \times 10^{19}$ and $1 \times 10^{20}$ atoms/cm$^3$. In this embodiment, doped region 51 is doped as a p-type region and doped region 53 is doped as an n-type region.

In alternative embodiments, doped region 51 may be doped as an n-type region and doped region 53 may be doped as a p-type region. In another alternative embodiment, both doped regions 51 and 53 may be doped as n-type regions. In still another alternative embodiment, one or more of regions 51 and 53 may be undoped. Additionally, although doped regions 51 and 53 are described as being produced by an ion implantation technique, other doping methods may also be used. For example, ions may be provided in layer of conductive or semiconductive material 50 using thermal diffusion or another technique.

Figure 3:
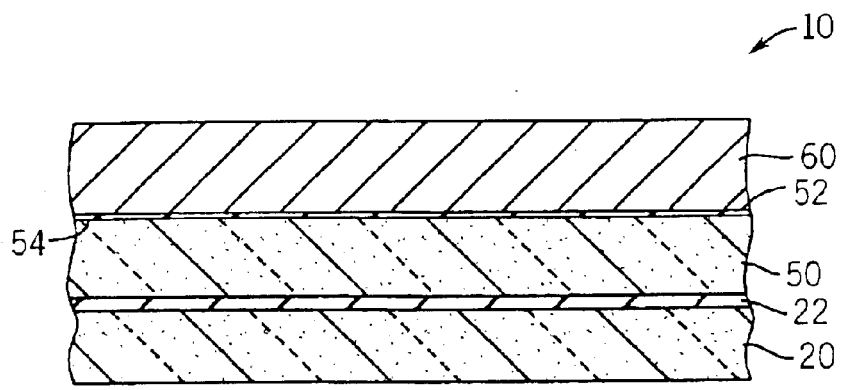
FIG. 3 is a schematic cross-sectional view of the portion shown in FIG. 1 illustrating an amorphous carbon layer deposition step.

In a step 230 shown in FIG. 3, a layer or film 60 of mask material comprising amorphous carbon (referred to hereinafter as amorphous carbon layer 60) is deposited above or over layer 50. Amorphous carbon layer 60 is deposited in a plasma-enhanced chemical vapor deposition (PECVD) process using a hydrocarbon atmosphere such as ethylene, propylene, methane, and the like. The PECVD process is performed at a temperature of between approximately 400° and 550° C. and a pressure of between approximately 5 and 10 torr with a plasma power of between approximately 800 and 1,500 watts.

In a preferred embodiment, amorphous carbon layer 60 has a thickness of between approximately 500 and 700 angstroms. In alternative embodiments, the thickness of amorphous carbon layer 60 may vary depending on various design considerations. For example, amorphous carbon layer 60 may have a thickness of less than 500 angstroms (e.g., between 300 and 500 angstroms or less). In another alternative embodiment, amorphous carbon layer 60 may have a thickness of greater than 700 angstroms (e.g., between 700 and 900 angstroms or greater).

One advantageous feature of providing amorphous carbon layer 60 that may be produced with various thicknesses is that amorphous carbon layer 60 may be produced in a thickness suitable for patterning layer of conductive or semiconductive material 50. For example, where a particular thickness of polysilicon is provided, the thickness of amorphous carbon layer 60 may be altered so that the proper amount of mask material is provided over the polysilicon material to compensate for the etch selectivities of the materials used. This allows for increased manufacturing efficiency by eliminating unnecessary material use.

In a preferred embodiment, amorphous carbon layer 60 is deposited above layer of conductive or semiconductive material 50 in a pure or undoped form. In an alternative embodiment, amorphous carbon layer 60 may be deposited with nitrogen incorporated therein. For example, amorphous carbon layer 60 as deposited may include between approximately 0 and 10 atomic percent nitrogen. To deposit a nitrogen-containing amorphous carbon layer, a PECVD process using an atmosphere of hydrocarbon and nitrogen (or other nitrogen-containing precursor) is used. To achieve a doping concentration of approximately 6 atomic percent nitrogen, for example, a flow ratio approximately 1:10 is used for the hydrocarbon to nitrogen gas flow rate (e.g., 300 cubic centimeters of hydrocarbon per minute to 3 liters of nitrogen per minute). In alternative embodiments, various other nitrogen concentrations may be achieved by varying the various processing conditions (e.g., increasing or decreasing the gas flow of nitrogen, etc.).

In another alternative embodiment, an inert ion species may be implanted or introduced into the amorphous carbon layer 60. In this embodiment, the inert ions may be implanted at an energy between approximately 1 and 2 keV to a concentration of between approximately 3 and 6 atomic percent. The implantation of ions into He amorphous carbon layer 60 may be performed in both nitrogen-doped and undoped amorphous carbon layers. Any of a variety of inert ions may be introduced or implanted into the amorphous carbon layer 60, including helium (He), argon (Ar), neon (Ne), krypton (Kr), xenon (Xe), and radon (Rn). Additionally, more than one inert ion species may be introduced into the amorphous carbon layer 60. For example, both helium and xenon ions may be implanted into amorphous carbon layer 60. Other combinations are also possible in various alternative embodiments.

In yet another alternative embodiment, only a portion of the amorphous carbon layer 60 is doped with nitrogen and/or an inert ion species. For example, a top portion of amorphous carbon layer 60 may be doped, while a bottom portion of amorphous carbon layer 60 may comprise pure or undoped amorphous carbon. In another example, the amorphous carbon layer 60 may include alternating layers of doped and undoped amorphous carbon material.

One advantageous feature of doping amorphous carbon layer 60 with nitrogen and/or inert ions is that the doping may act to relieve or reduce the internal stress of amorphous carbon layer 60. For example, where the internal stress of amorphous carbon layer 60 is generally compressive, the introduction of nitrogen or inert ions into amorphous carbon layer 60 may reduce the compressive stress or change the internal stress to tensile stress. By altering the stress profile of amorphous carbon layer 60, better shape integrity of patterns formed in amorphous carbon layer 60, and hence in the underlying material layer, may be obtained. For example, where amorphous carbon layer 60 is patterned to form a mask for creating a conductive line in an underlying material layer, reduced or altered internal stresses in the amorphous carbon mask may allow the mask to better retain its shape during processing, thus allowing the formation of conductive lines that do not exhibit warpage or wiggle characteristics.

Figure 4:
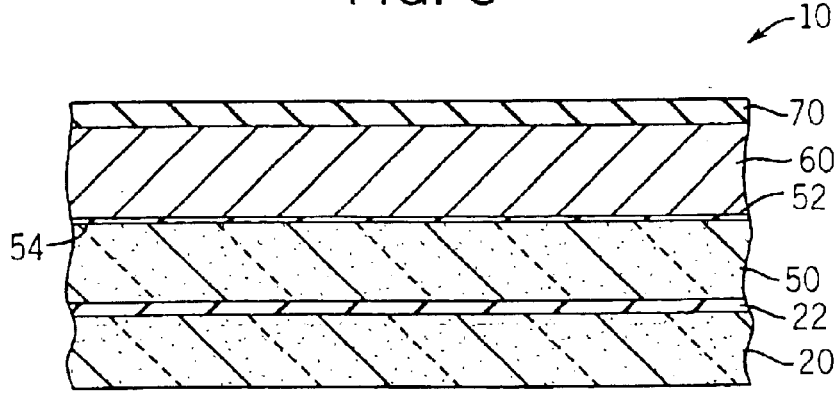
FIG. 4 is a schematic cross-sectional view of the portion shown in FIG. 1 illustrating an anti-reflective coating (ARC) layer deposition step.
Figure 5:
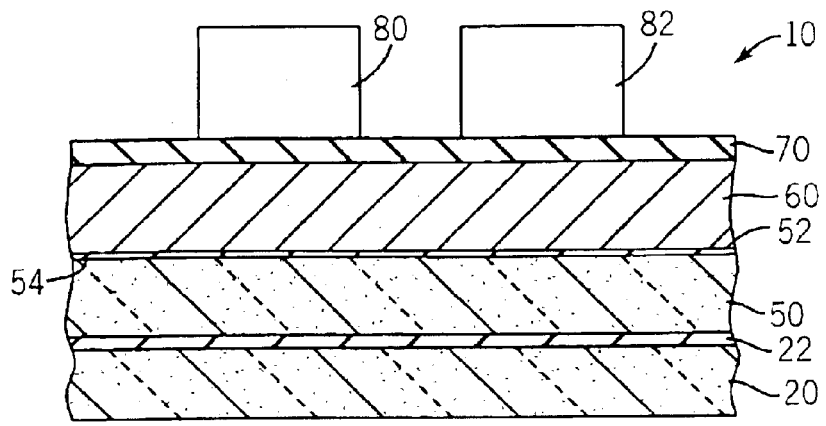
FIG. 5 is a schematic cross-sectional view of the portion shown in FIG. 1 illustrating a mask formation step.

In a step 240 shown in FIG. 4, a cap layer 70 is provided or deposited above amorphous carbon layer 60. To facilitate the description below, amorphous carbon layer 60 will be described with reference to the preferred embodiment described above, in which a layer of amorphous carbon is deposited in pure form (i.e., without nitrogen or inert ions being incorporated therein). Amorphous carbon layer 60 can be formed in any of a variety of ways depending on the desired amorphous carbon layer properties, as described above with regard to the various alternative embodiments.

Cap layer 70 may be formed of an anti-reflective material to form an anti-reflective coating (ARC) layer. Cap layer 70 may include silicon nitride (SiN), silicon oxynitride (SiON), silicon-rich oxide (e.g., non-stoichiometric oxide-containing silicon material), silicon-rich nitride, and the like. In an exemplary embodiment, cap layer 70 has a thickness of between approximately 150 and 250 angstroms. One advantageous feature of using a cap layer formed from an anti-reflective material is that the amorphous carbon layer will be protected during deposition and exposure of a photoresist material above amorphous carbon layer 60 and that reflection of ultraviolet (UV) rays used in the exposure of the photoresist will be reduced.

In a step 250, a layer of photoresist material is deposited above or over cap layer 70 (e.g., by spin-coating) and exposed to form photoresist features 80, 82. The layer of photoresist is deposited by spin coating at a thickness of between approximately 2000 and 4000 angstroms and is patterned to have a width of between approximately 80 and 150 nanometers. Any of a variety of photoresist materials may be used, including photoresist materials that may be etched using UV rays having wavelengths of 193 or 248 nanometers.

Figure 6:
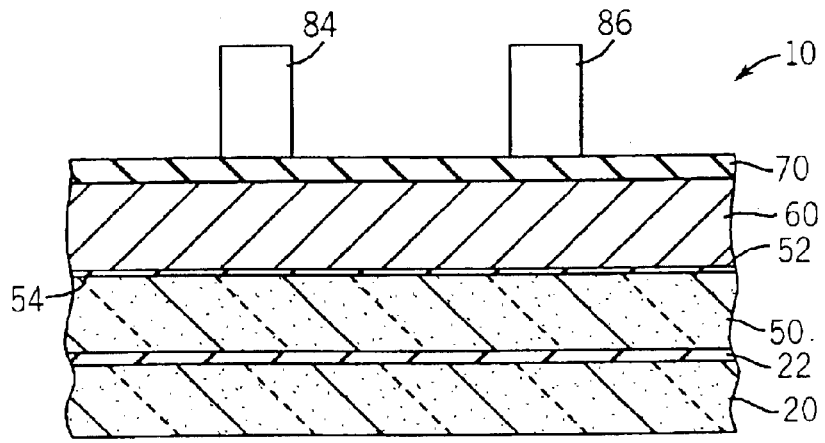
FIG. 6 is a schematic cross-sectional view of the portion shown in FIG. 1 illustrating a mask trimming step.

In a step 260 shown in FIG. 6, photoresist features 80, 82 are trimmed to form photoresist masks or features 84, 86 having reduced dimensions. Trimming is accomplished by exposing photoresist features to oxygen containing plasma ambients, where the lateral attack of the resist is enhanced, which results in photoresist masks having reduced dimensions. The thickness of the photoresist masks formed may depend on the trim rate. For example, in an exemplary embodiment, a trim etching step may erode or remove between approximately 3 to 4 nanometers per second in the vertical direction and between approximately 1.5 and 2.5 nanometers per second in the lateral direction. Other trim rates may be used, and may depend on the type of photoresist material used. Process 200 is particularly advantageous when narrow gate conductors are formed when using trim etching techniques.

In an exemplary embodiment, photoresist features 84, 86 have a thickness of between approximately 300 and 400 angstroms and a width of approximately 30 and 40 nanometers after trim etching. In alternative embodiments, the photoresist masks may have a thickness of between approximately 200 and 600 angstroms and a width of approximately 20 and 50 nanometers.

Figure 7:
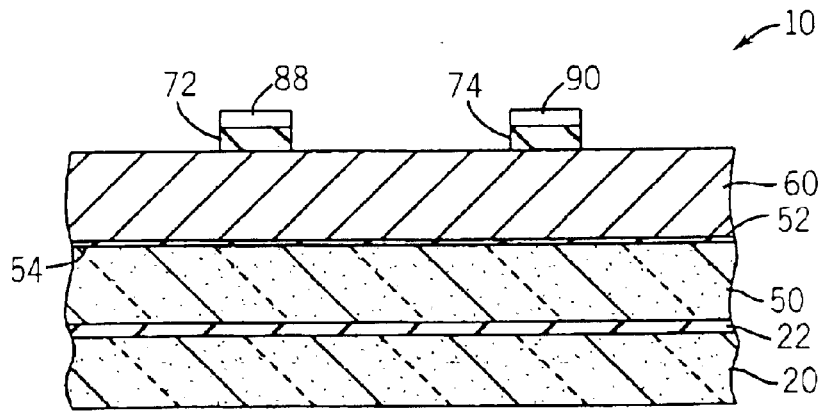
FIG. 7 is a schematic cross-sectional view of the portion shown in FIG. 1 illustrating a first step in the formation of an amorphous carbon ARC mask.

In a step 270 shown in FIG. 7, photoresist features 84, 86 are used as masks to pattern cap layer 70 to form cap features 72, 74. A small amount of photoresist material 88, 90 remains through the etching and overetching of cap layer 70. In an exemplary embodiment, cap layer 70 is etched using a fluorine-based plasma (e.g., $CF_4$, $CF_4/CHF_3$, etc.). The etching is performed in an argon or helium atmosphere at a temperature of between approximately 20° and 50° C. and a pressure of between approximately 3 and 50 millitorr.

Figure 8:
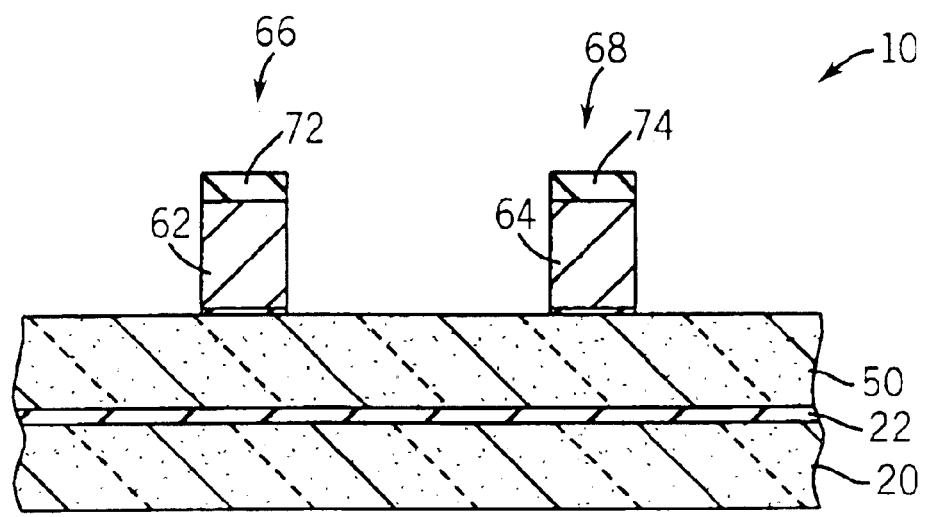
FIG. 8 is a schematic cross-sectional view of the portion shown in FIG. 1 illustrating a second step in the formation of an amorphous carbon ARC mask.

In a step 280 shown in FIG. 8, cap features 72, 74 are used as masks to pattern amorphous carbon layer 60 to form amorphous carbon features 62, 64. In an exemplary embodiment, amorphous carbon layer 60 is etched using an oxygen-based plasma at a temperature of between approximately 40° and 60° C. and a pressure of between approximately 3 and 10 millitorr. For example, the plasma used may be an oxygen-hydrogen-bromide plasma, an oxygen-nitrogen plasma, an oxygen-$CHF_3$ plasma, and the like. Argon may also be present in the atmosphere. The plasma power may be adjusted so that the ion density power is between approximately 800 and 1,200 watts and the ion energy control is between approximately 50 and 200 watts.

Using the plasma etch method described above, amorphous carbon features 62, 64 are formed without the introduction of aqueous etchants, which may damage or destroy amorphous carbon features 62, 64 as processing proceeds. For example, the use of phosphoric acid as an etchant is eliminated by using amorphous carbon, since portions of amorphous carbon layer 60 may be removed using a plasma etch.

In a step 290, a breakthrough etch is performed to remove a portion of oxide layer 52 from surface 54 of layer of conductive or semiconductive material 50 prior to patterning layer of conductive or semiconductive material 50. The breakthrough etch also begins to remove cap features 72, 74. The subsequent etching of the conductor material (e.g., polysilicon, etc.) results in complete erosion of the cap layer when the etch is complete.

Amorphous carbon feature 62 and cap feature 72 together comprise an amorphous carbon ARC mask or stack 66. Amorphous carbon feature 64 and cap feature 74 together comprise amorphous carbon ARC mask or stack 68. In an exemplary embodiment, amorphous carbon ARC masks 66, 68 have a width of between approximately 30 and 60 nanometers. In alternative embodiments, amorphous carbon ARC masks 66, 68 may have a width of less than 30 nanometers (e.g., 10–25 nanometers, etc.) or greater than 60 nanometers (e.g., 60–80 nanometers, etc.).

Figure 9:
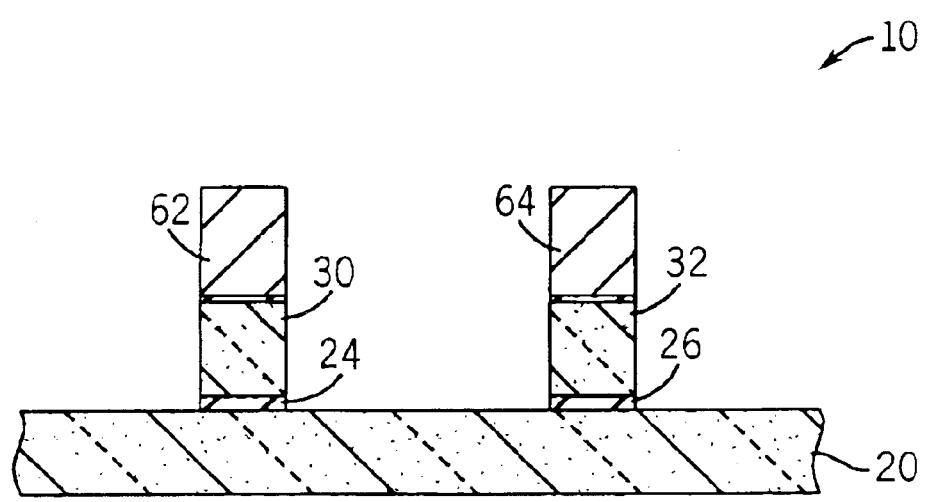
FIG. 9 is a schematic cross-sectional view of the portion shown in FIG. 1 illustrating a gate formation step.
Figure 10:
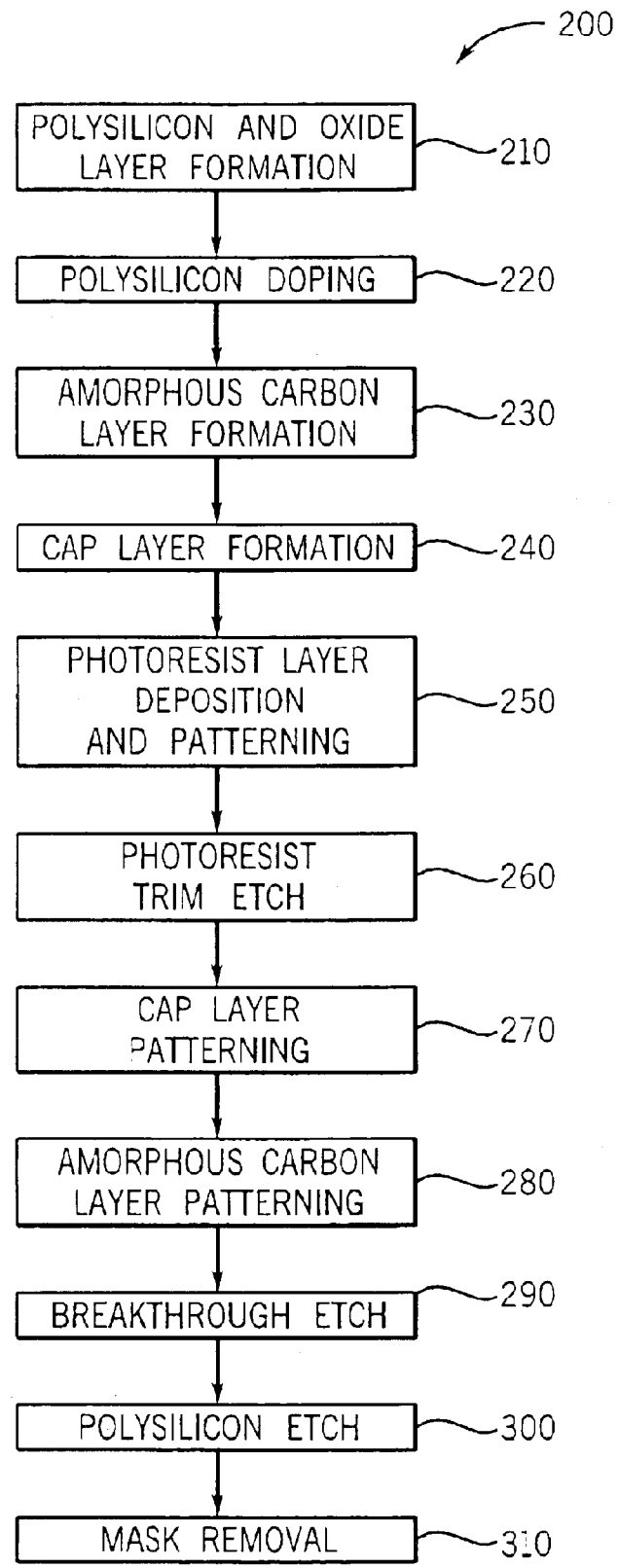
FIG. 10 is a flow diagram illustrating the process of forming structures in an integrated circuit.

In a step 300 shown in FIG. 9, amorphous carbon ARC masks 66, 68 are used to pattern or form features in layer of conductive or semiconductive material 50. For example, layer of conductive or semiconductive material 50 may be etched to form gate conductors 30, 32 (shown in FIG. 1). Gate conductor 30 is formed from material in doped region 51, and gate conductor 32 is formed from material in doped region 53. In accordance with an exemplary embodiment, gate conductor 30 is formed as a p-type doped polysilicon gate conductor, and gate conductor 32 is formed as an n-type doped polysilicon gate conductor. Where doped regions 51, 53 are doped differently in alternative embodiments, the composition of gate conductors 30, 32 may differ accordingly.

The polysilicon etch is performed using any of a variety of conventional etch chemistries (e.g., $HBr/Cl_2/O_2$, $HBr/Cl_2/N_2$, $HBr/Cl_2/O_2/CF_4$, $HBr/HF_3/O_2$, etc.) at a temperature of between approximately 40° and 60° C. and a pressure of between approximately 3 and 50 millitorr. In subsequent steps (not shown), additional material layers and features may be formed on or in portion 10. Cap features 72, 74 are consumed during etching of layer of conductive or semiconductive material 50 to leave amorphous carbon features 62, 64 exposed.

In a step 310, amorphous carbon features 62, 64 are removed after layer of conductive or semiconductive material 50 is patterned (e.g., to form gate conductors 30, 32 shown in FIG. 1). Amorphous carbon features 62, 64 may be removed using methods similar to those described above.

For example, the amorphous carbon may be removed using an oxygen-containing plasma to expose the top surface of gate conductors 30, 32. To quickly remove the amorphous carbon material, amorphous carbon features 62, 64 may be quickly etched or "ashed" at a temperature between approximately 180° and 220° C. at a pressure of between approximately 1 and 2 torr at a power level of between approximately 800 and 1200 watts using an oxygen-based plasma having approximately 5% nitrogen. In subsequent processing steps, other material layers and devices may be added to portion 10 to form a complete integrated circuit.

Because the masks used to pattern layer of conductive or semiconductive material 50 are made from an amorphous carbon material that does not require an aqueous acid removal technique (e.g., a phosphoric acid wet bath, etc.), the amorphous carbon may be removed without damaging the material used to form gate conductors 30, 32. For example, the amorphous carbon material may be removed by etching or "ashing" using an oxygen-based plasma. Where gate conductors 30, 32 are formed from a polysilicon material, this advantageously eliminates the requirement that gate conductors 30, 32 be re-oxidized to form a layer of oxide on the sides of gate conductors 30, 32 to protect the gate conductors from damage caused by an acid etch. In this manner, the requirement of an elevated-temperature re-oxidation step is eliminated, thus reducing unnecessary increases in the thermal budget of processing.

While the exemplary embodiments illustrated in the FIGURES and described above are presently preferred, it should be understood that these embodiments are offered by way of example only. Other embodiments may include, for example, different methods of depositing the various layers above the substrate, different combination of times, temperatures, pressures, and the like. The invention is not limited to a particular embodiment, but extends to various modifications, combinations, and permutations that nevertheless fall within the spirit and scope of the appended claims.

What is claimed is:

1. A method of producing an integrated circuit comprising:
   providing a layer of polysilicon above a semiconductor substrate;
   doping the layer of polysilicon;
   providing a layer of mask material above the layer of polysilicon, the mask material comprising amorphous carbon;
   providing a layer of anti-reflective coating (ARC) material above the layer of mask material and patterning the layer of ARC material;
   patterning the layer of mask material to form a mask in a first etching step;
   removing a portion of the layer of polysilicon according to the mask to form a gate conductor in a second etching step utilizing a different etch chemistry than that utilized in the first etching step; and
   removing the mask.

2. The method of claim 1, wherein the ARC material comprises at least one of silicon nitride, silicon oxynitride, silicon-rich nitride, and silicon rich oxide.

3. The method of claim 1, wherein the step of doping the layer of polysilicon comprises introducing at least one of boron and phosphorous ions into the layer of polysilicon.

4. A method of producing an integrated circuit comprising:
   providing a layer of polysilicon above a semiconductor substrate;
   doping the layer of polysilicon;
   providing a layer of mask material above the layer of polysilicon, the mask material comprising amorphous carbon;
   patterning the layer of mask material to form a mask in a first etching step;
   removing a portion of the layer of polysilicon according to the mask to form a gate conductor in a second etching step utilizing a different etch chemistry than that utilized in the first etching step; and
   removing the mask;
   wherein the step of doping the layer of polysilicon comprises introducing at least one of boron and phosphorous ions into the layer of polysilicon; and
   wherein the layer of polysilicon is doped to a concentration of between approximately $1 \times 10^{19}$ and $1 \times 10^{20}$ atoms/cm$^3$.

5. A method of producing an integrated circuit comprising:
   providing a layer of polysilicon above a semiconductor substrate;
   doping the layer of polysilicon;
   providing a layer of mask material above the layer of polysilicon, the mask material comprising amorphous carbon;
   patterning the layer of mask material to form a mask in a first etching step;
   removing a portion of the layer of polysilicon according to the mask to form a gate conductor in a second etching step utilizing a different etch chemistry than that utilized in the first etching step; and
   removing the mask;
   wherein the layer of mask material comprises at least one of nitrogen, helium, argon, krypton, neon, xenon, and radon.

6. The method of claim 5, wherein the layer of mask material comprises at least one of helium, argon, krypton, neon, xenon, and radon.

7. A method of producing an integrated circuit comprising:
   providing a layer of polysilicon above a semiconductor substrate;
   doping the layer of polysilicon;
   providing a layer of mask material above the layer of polysilicon, the mask material comprising amorphous carbon;
   patterning the layer of mask material to form a mask in a first etching step;
   removing a portion of the layer of polysilicon according to the mask to form a gate conductor in a second etching step utilizing a different etch chemistry than that utilized in the first etching step; and
   wherein the mask has a width of between approximately 30 and 50 nanometers.

8. A method of producing an integrated circuit comprising:
   providing a layer of polysilicon above a semiconductor substrate;
   doping the layer of polysilicon;
   providing a layer of mask material above the layer of polysilicon, the mask material comprising amorphous carbon;
   patterning the layer of mask material to form a mask in a first etching step;

removing a portion of the layer of polysilicon according to the mask to form a gate conductor in a second etching step utilizing a different etch chemistry than that utilized in the first etching step; and wherein the layer of mask material has a thickness of between approximately 500 and 700 angstroms.

9. A method of producing an integrated circuit comprising:

providing a layer of polysilicon above a semiconductor substrate;

doping the layer of polysilicon;

providing a layer of mask material above the layer of polysilicon, the mask material comprising amorphous carbon;

patterning the layer of mask material to form a mask in a first etching step;

removing a portion of the layer of polysilicon according to the mask to form a gate conductor in a second etching step utilizing a different etch chemistry than that utilized in the first etching step; and wherein the step of removing the mask includes using an oxygen plasma etch technique at a temperature of between approximately 180° and 220° C.

10. A method of forming features in an integrated circuit comprising:

providing a layer of conductive material above a semiconductor substrate, the layer of conductive material comprising polysilicon and a dopant element;

providing an amorphous carbon layer above the layer of conductive material;

providing a cap layer over the amorphous carbon layer;

patterning the cap layer to form a cap feature;

removing a portion of the amorphous carbon layer according to the cap feature to form a hard mask utilizing a plasma etchant;

etching the layer of conductive material according to the hard mask to form a feature utilizing an etch chemistry that differs from the plasma etchant; and removing the hard mask;

whereby the step of removing the hard mask may be accomplished without the need to oxidize the feature formed in the layer of conductive material.

11. The method of claim 10, wherein the dopant element is selected from boron and phosphorous.

12. The method of claim 10, wherein the cap layer comprises at least one of silicon nitride, silicon oxynitride, silicon-rich nitride, and silicon-rich oxide.

13. The method of claim 10, wherein the feature formed in the layer of conductive material is a gate conductor having a width of less than approximately 50 nanometers.

14. The method of claim 10, wherein the steps of removing a portion of the amorphous carbon layer and removing the hard mask comprise using an oxygen-based plasma.

15. The method of claim 10, wherein the step of etching the layer of conductive material utilizes an etch chemistry selected from $HBr/Cl_2/O_2$, $HBr/Cl_2/N_2$, $HBr/Cl_2/O_2/CF_4$, and $HBr/HF_3/O_2$.

16. The method of claim 10, wherein the amorphous carbon layer comprises at least one of helium, argon, krypton, neon, xenon, and radon.

17. The method of claim 12, wherein the step of patterning the cap layer comprises providing a layer of photoresist material above the cap layer and exposing the layer of photoresist material to form a photoresist mask.

18. A method of forming an integrated circuit, the method comprising:

depositing a layer of gate material above a silicon wafer;

doping the layer of gate material with at least one ion species;

forming a mask over the layer of gate material utilizing a first etchant, the mask comprising amorphous carbon;

removing at least a portion of the layer of gate material according to the mask utilizing a second etchant that differs from the first etchant; and removing the mask;

wherein the mask is removed without the use of an aqueous acid etchant.

19. The method of claim 18, wherein the step of removing at least a portion of the layer of gate material comprises forming a gate conductor having a width of less than approximately 50 nanometers.

20. The method of claim 18, wherein the gate material comprises polysilicon and wherein the ion species comprises one of boron and phosphorous.

21. The method of claim 18, wherein the step of forming a mask comprises depositing a layer of amorphous carbon over the layer of gate material and depositing a layer of anti-reflective coating (ARC) material over the layer of amorphous carbon.

22. The method of claim 18, wherein the mask comprises at least one of helium, argon, krypton, neon, xenon, and radon.

23. The method of claim 18, wherein the second etchant is selected from $HBr/Cl_2/O_2$, $HBr/Cl_2/N_2$, $HBr/Cl_2/O_2/CF_4$, and $HBr/HF_3/O_2$.

24. The method of claim 21, wherein the step of removing the mask comprises utilizing an oxygen-based plasma at a temperature between approximately 180° and 220° C.

25. A method of producing an integrated circuit comprising:

providing a layer of polysilicon above a semiconductor substrate;

doping the layer of polysilicon;

providing a layer of mask material above the layer of polysilicon, the mask material comprising amorphous carbon;

patterning the layer of mask material to form a mask in a first etching step;

removing a portion of the layer of polysilicon according to the mask to form a gate conductor in a second etching step utilizing a different etch chemistry than that utilized in the first etching step; and removing the mask;

wherein the step of doping the layer of polysilicon comprises introducing at least one of boron and phosphorous ions into the layer of polysilicon; and wherein the first etching step utilizes a plasma etchant and the second etching step utilizes an etch chemistry selected from $HBr/Cl_2/O_2$, $HBr/Cl_2/N_2$, $HBr/Cl_2/O_2/CF_4$, and $HBr/HF_3/O_2$.

* * * * *